(12) United States Patent
Kronenberger et al.

(10) Patent No.: US 12,112,910 B2
(45) Date of Patent: Oct. 8, 2024

(54) PROTECTIVE DEVICE FOR A HIGH-VOLTAGE CABLE, HIGH-VOLTAGE CABLE, HIGH-VOLTAGE ON-BOARD POWER SUPPLY AND MOTOR VEHICLE

(71) Applicant: Bayerische Motoren Werke Aktiengesellschaft, Munich (DE)

(72) Inventors: Thomas Kronenberger, Jetzendorf (DE); Benedikt Nies, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 283 days.

(21) Appl. No.: 17/689,512

(22) Filed: Mar. 8, 2022

(65) Prior Publication Data

US 2022/0310345 A1 Sep. 29, 2022

(30) Foreign Application Priority Data

Mar. 25, 2021 (DE) ...................... 10 2021 107 539.4

(51) Int. Cl.
*H01H 37/52* (2006.01)
*B60R 16/03* (2006.01)
(Continued)

(52) U.S. Cl.
CPC ......... *H01H 85/0241* (2013.01); *B60R 16/03* (2013.01); *H01B 9/02* (2013.01); *H01H 37/52* (2013.01); *H01H 85/055* (2013.01)

(58) Field of Classification Search
CPC ... H01B 9/02; H01B 9/04; H01B 9/06; H01B 11/20; B60R 16/023; H01R 13/68;
(Continued)

(56) References Cited

U.S. PATENT DOCUMENTS

| | | | | |
|---|---|---|---|---|
| 3,678,432 A | * | 7/1972 | Boliver | H01H 85/20 439/282 |
| 3,824,431 A | * | 7/1974 | Schlicke | H02H 9/005 338/21 |

(Continued)

FOREIGN PATENT DOCUMENTS

| | | |
|---|---|---|
| CN | 212412357 U | 1/2021 |
| DE | 27 40 371 A1 | 3/1978 |

(Continued)

OTHER PUBLICATIONS

German-language Search Report issued in German Application No. 10 2021 107 539.4 dated Oct. 27, 2021 with English translation (14 pages).

*Primary Examiner* — William H. Mayo, III
(74) *Attorney, Agent, or Firm* — Crowell & Moring LLP

(57) ABSTRACT

A protective device to be integrated into a high-voltage cable of a high-voltage on-board power supply includes a cut-out for interrupting at least one electrical conductor of the high-voltage cable in a fault scenario, a shielding element for forming a cable shield with a shielding conductor of the high-voltage cable, and a housing to be arranged between two high-voltage-cable sections of the high-voltage cable. In the housing, the cut-out and the shielding element are arranged, and the housing has contacts for connecting the cut-out to conductor sections of the at least one conductor and for connecting the shielding element to shielding-conductor sections of the shielding conductor. At least a part of the housing is capable of being non-destructively detached from the high-voltage-cable sections, in order to enable an exchange of at least the cut-out in the case of a defect of the cut-out.

12 Claims, 3 Drawing Sheets

(51) Int. Cl.
  *H01B 9/02* (2006.01)
  *H01H 85/02* (2006.01)
  *H01H 85/055* (2006.01)

(58) Field of Classification Search
  CPC ........ H01R 24/26; H01R 13/52; H01H 85/00;
        H01H 3/00; H01H 3/16; H01H 27/06;
        H01H 31/12; G01R 31/006; G01R 27/18;
        G01R 31/52; G01R 15/16; G01R 19/0084
  USPC .................. 174/74 R–92; 439/502, 620.26;
        200/500–517, 555–573; 324/551
  See application file for complete search history.

(56) References Cited

U.S. PATENT DOCUMENTS

| | | | |
|---|---|---|---|
| 4,060,785 A | 11/1977 | Hanke et al. | |
| 5,316,492 A * | 5/1994 | Schaareman | H02G 15/184 439/796 |
| 6,353,195 B1 * | 3/2002 | Stanfield | H04N 7/102 200/11 R |
| 11,049,632 B2 * | 6/2021 | Aromin | H01B 1/023 |
| 11,175,328 B1 * | 11/2021 | Kronenberger | G01R 31/006 |
| 2006/0092585 A1 * | 5/2006 | Chan | H02H 1/0015 361/42 |
| 2011/0006781 A1 * | 1/2011 | Kawamura | G01R 31/52 324/551 |
| 2011/0104940 A1 * | 5/2011 | Rabu | H01R 31/065 439/502 |
| 2016/0084888 A1 * | 3/2016 | Busemann | G01R 15/16 324/126 |

FOREIGN PATENT DOCUMENTS

| | | | | |
|---|---|---|---|---|
| DE | 10 2014 017 230 A1 | 6/2015 | | |
| DE | 102018130830 B3 * | 1/2020 | ............ | G01R 27/18 |
| JP | 2008-226624 A | 9/2008 | | |
| WO | WO 84/00078 A * | 1/1984 | ............ | H01H 85/00 |
| WO | WO 2016/050408 A * | 4/2006 | ............ | B60R 16/023 |

* cited by examiner

PROTECTIVE DEVICE FOR A HIGH-VOLTAGE CABLE, HIGH-VOLTAGE CABLE, HIGH-VOLTAGE ON-BOARD POWER SUPPLY AND MOTOR VEHICLE

CROSS REFERENCE TO RELATED APPLICATION

This application claims priority under 35 U.S.C. § 119 from German Patent Application No. 10 2021 107 539.4, filed Mar. 25, 2021, the entire disclosure of which is herein expressly incorporated by reference.

BACKGROUND AND SUMMARY OF THE INVENTION

The invention relates to a protective device for a high-voltage cable of a high-voltage on-board power supply, said device exhibiting a cut-out for interrupting at least one electrical conductor of the high-voltage cable in a fault scenario. In addition, the invention relates to a high-voltage cable, a high-voltage on-board power supply and a motor vehicle.

In the present case, interest is directed toward high-voltage on-board power supplies for motor vehicles, in particular motor vehicles capable of being propelled electrically. Such high-voltage on-board power supplies conventionally have a plurality of high-voltage components, for instance an electric drive motor, a traction battery and power electronics. For the purpose of electrically connecting the high-voltage components, high-voltage cables or high-voltage leads are provided which are electrically connected to the high-voltage components, for instance via plug connections. In order to be able to isolate the high-voltage components from one another in the case of a fault, for instance in the event of an overcurrent flowing via the high-voltage cable or in the event of an excess temperature, protective devices with cut-outs are conventionally provided. Such cut-outs may be, for instance, fusible cut-outs that have been permanently built into the high-voltage cable and have been designed to interrupt an electrical conductor of the high-voltage cable. In the event of a defect of the cut-out—for instance, after the fusible cut-out has tripped—as a rule the entire high-voltage cable has to be exchanged, which is an elaborate and cost-intensive procedure.

It is the object of the present invention to provide an inexpensive and low-effort solution for exchanging a defective cut-out of a protective device of a high-voltage cable.

In accordance with the invention, this object is achieved by a protective device, a high-voltage cable, a high-voltage on-board power supply and a motor vehicle with the features according to the respective independent claims. Advantageous embodiments of the invention are subjects of the dependent claims, the description and the figures.

A protective device according to the invention to be integrated into a high-voltage cable of a high-voltage on-board power supply exhibits a cut-out, for interrupting at least one electrical conductor of the high-voltage cable in a fault scenario, and a shielding element for forming a cable shield with a shielding conductor of the high-voltage cable. In addition, the protective device exhibits a housing to be arranged between two high-voltage-cable sections of the high-voltage cable. The cut-out and the shielding element are arranged in the housing. The housing exhibits contacts for connecting the cut-out to conductor sections of the at least one conductor and for connecting the shielding element to shielding-conductor sections of the shielding conductor. At least a part of the housing is capable of being non-destructively detached from the high-voltage-cable sections, in order to enable an exchange of at least the cut-out in the case of a defect of the cut-out.

In addition, the invention encompasses a high-voltage cable for a high-voltage on-board power supply, with at least one electrical conductor, with a shielding conductor and with at least one protective device according to the invention. The protective device is arranged between, and connected to, two high-voltage-cable sections which each exhibit a conductor section and a shielding-conductor section. The cut-out is arranged between two conductor sections of the at least one electrical conductor and electrically connected to said conductor sections. The shielding element is arranged between two shielding-conductor sections of the shielding conductor and electrically connected to said shielding-conductor sections to form the cable shield. The high-voltage cable may exhibit several conductors or wires which are electrically insulated from one another and surrounded by an insulating cable jacket. The shielding conductor may be, for instance, a metallic braid and may surround the conductors that are insulated from each other. The shielding conductor or the shielding serves for preventing an irradiation by and/or emission of electromagnetic fields. In particular, the high-voltage cable exhibits at least one, preferentially two, plug connectors by means of which the high-voltage cable can be electrically connected to at least one high-voltage component of the high-voltage on-board power supply. The at least one plug connector may be, for instance, a high-voltage plug or a high-voltage socket.

A high-voltage on-board power supply according to the invention includes at least two high-voltage components and at least one high-voltage cable according to the invention, which electrically connects the at least two high-voltage components. The high-voltage components may be, for instance, a high-voltage battery, an electric drive motor, power electronics or such like.

The high-voltage cable or the high-voltage lead exhibits the integrated protective device and consequently takes the form of a ready-to-connect, assembled high-voltage cable. For this purpose, the housing of the protective device is arranged between the two high-voltage-cable sections and connected thereto. The protective device exhibits the cut-out arranged in the housing, which is electrically connected to the two conductor sections of the at least one electrical conductor. For this purpose, the housing exhibits the contacts via which the conductor sections can be routed to the cut-out arranged in the housing and electrically connected to said cut-out. In the case of a fault—for instance, in the event of an overcurrent and/or an excess temperature—the cut-out trips, and isolates the two conductor sections from one another. As a result, the at least one electrical conductor and hence the high-voltage cable is interrupted. The cut-out may be designed to be reversible—that is to say, resettable—or irreversible—that is to say, non-resettable. For instance, the cut-out may include at least one temperature-controlled bimetallic switch and/or at least one fusible cut-out.

In addition, the protective device exhibits a shielding element. Together with the shielding conductor of the high-voltage cable, which is interrupted by the protective device and divided into the two shielding-conductor sections, this shielding element forms the cable shield. The shielding element may be, for instance, a shielding plate. The shielding-conductor sections are also routed via the contacts to the shielding element arranged in the housing, and are electrically connected to said shielding element.

In order now to be able to exchange the cut-out in the case of a defect, at least a part of the housing is capable of being detached from the high-voltage lead. In the case of a cut-out tripping irreversibly—for instance, in the case of a fusible cut-out—the cut-out may be defective by reason of the tripping. In this case, the entire housing with the cut-out and with the shielding can, for instance, be removed and exchanged. For this purpose, the contacts take the form of plug connectors, for instance, which can be plugged together with corresponding plug connectors of the high-voltage-cable sections. Alternatively, just a part of the housing can be removed, in order to be able to open the housing and to be able to exchange only the defective cut-out. Accordingly, in the event of a defect of the cut-out, advantageously the entire high-voltage cable does not have to be exchanged.

In particular, the housing exhibits a lower housing part and an upper housing part. The cut-out and the shielding element are arranged in the lower housing part. The lower housing part is fastened to the high-voltage-cable sections. The upper housing part is fastened to the lower housing part in non-destructively detachable manner for the purpose of opening the housing for an exchange of the cut-out. The upper housing part forms a housing cover for the lower housing part. In the joined state of the lower housing part and the upper housing part, these parts form a housing interior in which the cut-out and the shielding element are arranged. If the cut-out is defective, the upper housing part can be removed from the lower housing part, so that the defective cut-out is accessible for an exchange. The upper housing part is preferentially fastened to the lower housing part by means of a snap-action connection. Such a snap-action connection is particularly easy to release and also to close again.

There may also be provision that the upper housing part and the lower housing part exhibit guide elements, corresponding to one another, for joining the upper housing part and the lower housing part together. Such guide elements may be pins or bolts which are arranged, for instance, on the upper housing part and can be inserted into blind-hole-like guide elements of the lower housing part. In this way, a secure and intended closure of the housing can be guaranteed after exchange of the cut-out.

The contacts preferentially take the form of grommet-like conduits in a housing wall of the housing, the shielding-conductor sections and the conductor sections being capable of being routed through the conduits and capable of being electrically connected to the shielding element and to the cut-out. This embodiment is particularly advantageous if the housing is only partially detachable from the high-voltage-cable sections. The conduits are formed, in particular, in a housing wall assigned to the lower housing part. Via the conduits, the conductor sections and the shielding-conductor sections can be inserted into the housing interior and connected there to the cut-out and to the shielding element, respectively.

It proves to be advantageous if the protective device exhibits plug-connection elements which are electrically connected to the cut-out and capable of being electrically connected to corresponding plug-connection elements of the conductor sections. The defective cut-out can accordingly be taken out of the housing simply by releasing the plug connection, and can be replaced by a new cut-out. In the case of the completely exchangeable protective device, the plug-connection elements can be integrated into the contacts in the housing wall. But it may also be the case that the conductor sections with the corresponding plug-connection elements are routed through the conduits into the housing interior and connected there to the cut-out by being plugged together. For the purpose of exchanging the cut-out, the housing cover is removed, the cut-out is taken out by releasing the plug connection, and a new cut-out is plugged in. Then the housing cover is placed back onto the lower housing part for the purpose of sealing the housing.

In a further development of the invention, the protective device exhibits screw (luster)-terminal-type connecting elements which each exhibit a terminal block, which is electrically connected to the shielding element, and a terminal screw for connecting the shielding-conductor sections of the high-voltage cable to the terminal block. According to this embodiment, the shielding-conductor sections are routed, in particular, through the conduits of the housing wall into the housing interior and connected there to the terminal block via the terminal screws. This terminal block is electrically connected to the shielding element. The screw-terminal-type connecting elements and the shielding element are arranged, in particular, in the lower housing part, which is detachably connected to the upper housing part. Consequently, in the event of a defect of the cut-out only the cut-out can be exchanged, without having to release the screw-terminal-type connection.

The invention encompasses, in addition, a motor vehicle with a high-voltage on-board power supply according to the invention. In particular, the motor vehicle takes the form of an electrified motor vehicle—that is to say, an electric vehicle or hybrid vehicle.

The embodiments presented with reference to the protective device according to the invention, and the advantages thereof, apply correspondingly to the high-voltage cable according to the invention, to the high-voltage on-board power supply according to the invention, and to the motor vehicle according to the invention.

Further features of the invention arise out of the claims, the figures and the description of the figures. The features and combinations of features mentioned above in the description, as well as the features and combinations of features mentioned below in the description of the figures and/or shown only in the figures, are capable of being used not only in the respectively specified combination but also in other combinations or on their own.

The invention will now be elucidated in more detail on the basis of a preferred exemplary embodiment and with reference to the drawings.

BRIEF DESCRIPTION OF THE DRAWINGS

In the figures, identical and also functionally identical elements have been provided with the same reference symbols.

DETAILED DESCRIPTION OF THE DRAWINGS

Figure 1:
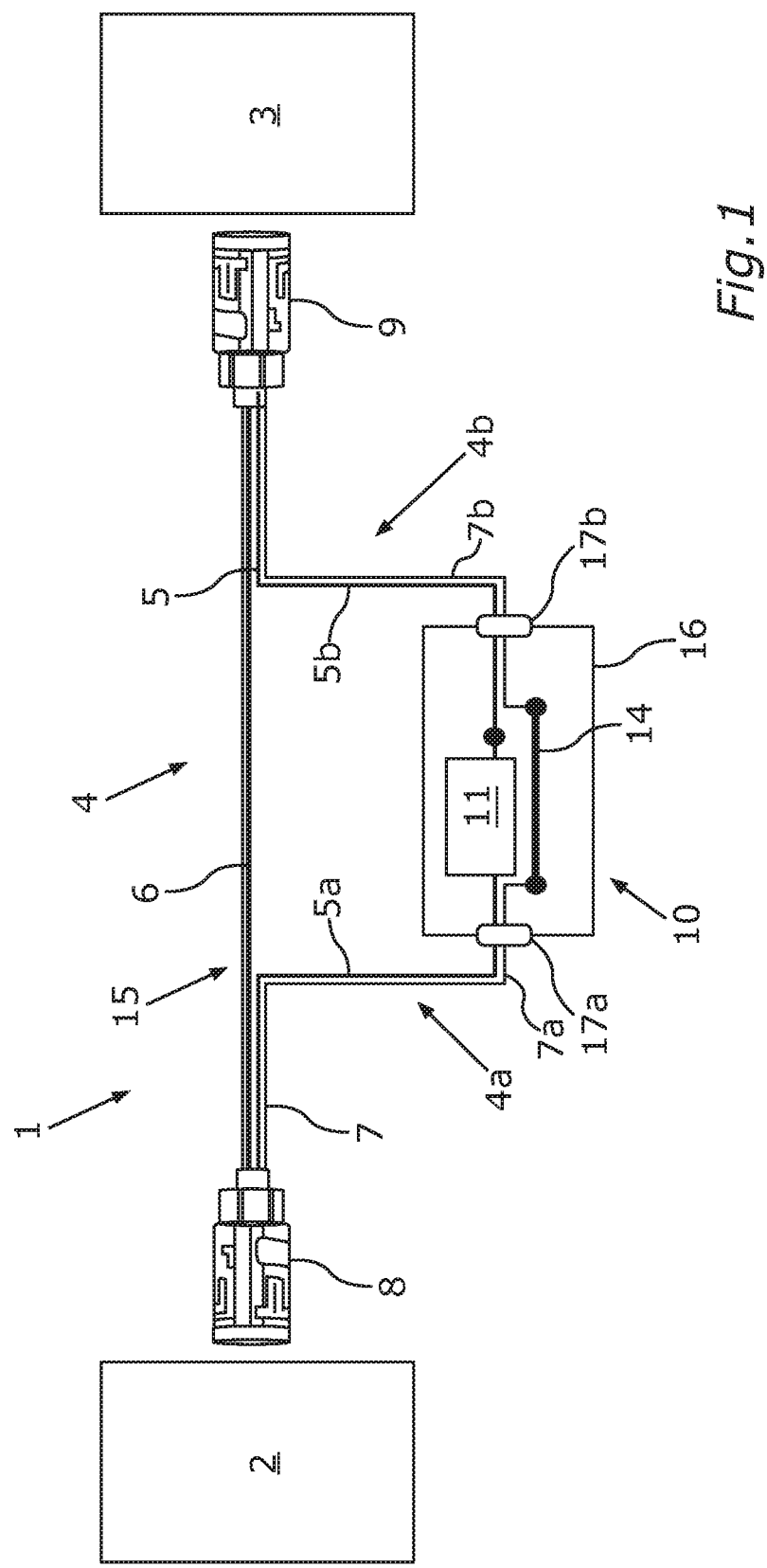
FIG. 1 is a schematic representation of an embodiment of a high-voltage on-board power supply.

FIG. 1 shows a high-voltage on-board power supply 1 for a motor vehicle. The high-voltage on-board power supply 1 exhibits two high-voltage components 2, 3 and a high-voltage cable 4 or a high-voltage lead. By means of the high-voltage cable 4, the high-voltage components 2, 3 can be electrically connected. The high-voltage cable 4 here exhibits two electrical conductors 5, 6 and a shielding conductor 7 or a shield. The shielding conductor 7 may be, for instance, a metal braid which surrounds the conductors 5, 6 which are insulated from each other for the purpose of improving electromagnetic compatibility and for the purpose of ensuring a low-interference signal transmission. The high-voltage cable 4 exhibits, in addition, plug connectors 8, 9 for plugging onto the high-voltage components 2, 3.

The high-voltage cable 4 further exhibits a protective device 10 which is designed to isolate the high-voltage components 2, 3 from one another, in particular galvanically, in the case of a fault. The protective device 10 is arranged between two high-voltage-cable sections 4a, 4b and connected to these high-voltage-cable sections 4a, 4b to form a ready-to-connect, assembled high-voltage cable 4. A cut-out 11 is arranged in at least one of the conductors 5, 6—here, in conductor 5. This cut-out 11 is electrically connected to two conductor sections 5a, 5b of the conductor 5 and designed to isolate the conductor sections 5a, 5b in the case of a fault for the purpose of interrupting the conductor 5.

The cut-out 11 may be, for instance, an overcurrent-protection device, which interrupts the conductor 5 in the event of an overcurrent, and/or a thermal cut-out which interrupts the conductor 5 in the event of an excess temperature. The cut-out 11 may take the form, for instance, of a fusible cut-out 12 as shown in FIG. 2a, or of a temperature-controlled bimetallic switch 13 as shown in FIG. 2b.

In addition, the protective device 10 exhibits a shielding element 14 which is connected to shielding-conductor sections 7a, 7b of the shielding conductor 7 to form a cable shield 15 of the high-voltage cable 4. The shielding element 14 and the cut-out 11 are arranged in a housing 16 which is arranged on the high-voltage-cable sections 4a, 4b. The housing 16 exhibits contacts 17a, 17b via which the cut-out 11 can be electrically connected to the conductor sections 5a, 5b and via which the shielding element 14 can be electrically connected to the shielding-conductor sections 7a, 7b. At least a part of the housing 16 can be non-destructively detached from the high-voltage-cable sections 4a, 4b, in order, in the case of a defect of the cut-out 11, to have to exchange only the cut-out 11 but not the entire high-voltage cable 4.

Figure 2B:
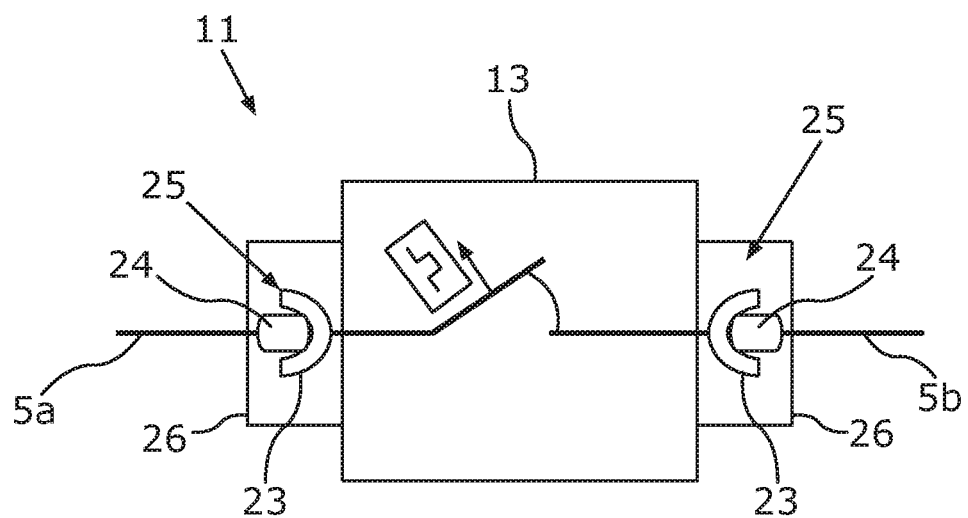
Figure 3:
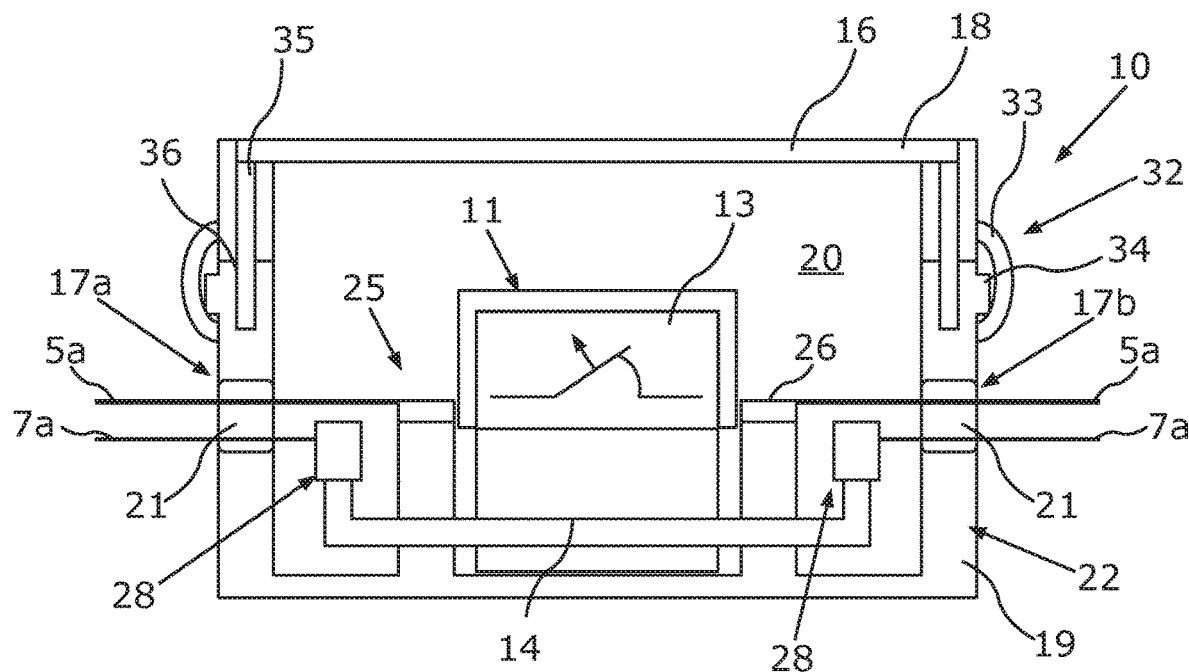
FIG. 3 is a schematic representation of an embodiment of a protective device.

The protective device 10 is shown by way of example in FIG. 3. The housing 16 exhibits an upper housing part 18 and a lower housing part 19, which enclose a housing interior 20. The cut-out 11 and the shielding element 14 are arranged in the housing interior 20 in the region of the lower housing part 19. The contacts 17a, 17b take the form of grommet-like conduits 21 in a housing wall 22 of the lower housing part 19, through which the conductor sections 5a, 5b and the shielding-conductor sections 7a, 7b are routed into the housing interior 20. In the housing interior 20 the conductor sections 5a, 5b are electrically connected to the cut-out 11. For this purpose, the cut-out 11 and the conductor sections 5a, 5b may exhibit plug-connection elements 23, 24 corresponding to one another, as shown with reference to the temperature-controlled bimetallic switch 13 in FIG. 2b, so that in the case of a defect the cut-out 11 can be exchanged by the plug connection 25 constituted by the plug-connection elements 23, 24 being released. The plug connection 25 may, in addition, have been thermally coupled with a heat-sink 26. For this purpose, the cut-out-side plug-connection element 23 may, for instance, have been fastened to a metal sheet.

Figure 2A:
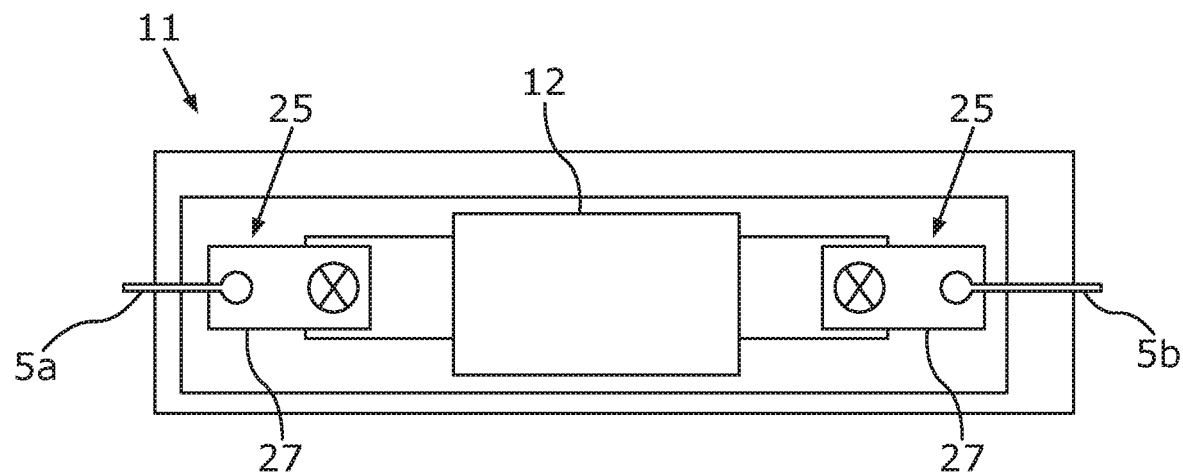
FIGS. 2a and 2b are schematic representations of embodiments of cut-outs.

The cut-out 11 can also be realized, as shown with reference to the fusible cut-out 12 in FIG. 2a, with the aid of a plug connection 25 by means of a cable lug 27 arranged on the cut-out 11. Of course, the plug connection 25 according to FIG. 2b may also be applied to the cut-out according to FIG. 2a, and conversely.

Figure 4:
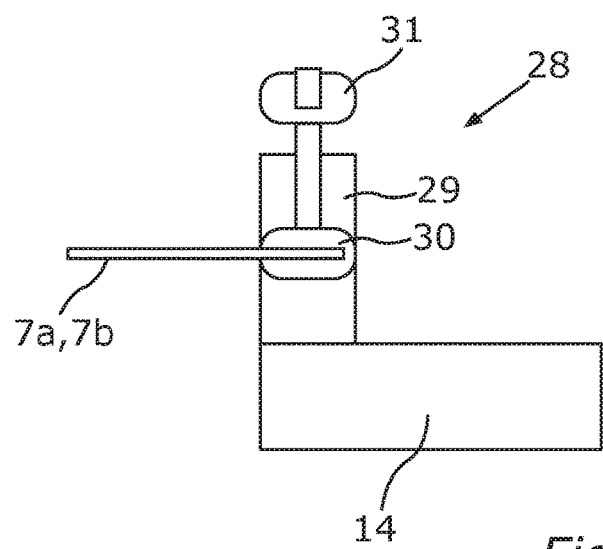
FIG. 4 is a schematic representation of an embodiment of a screw-terminal-type connecting element.

For the purpose of electrically connecting the shielding element 14 to the shielding-conductor sections 7a, 7b, the protective device 10 may exhibit screw-terminal-type connecting elements 28 as shown in FIG. 4, which are arranged in the housing 16. The screw-terminal-type connecting elements 28 exhibit a terminal block 29 which is electrically and mechanically connected to the shielding element 14 and which has a tubular profile 30. The terminal block 29 consists at least partially of an electrically conductive material. The shielding-conductor section 7a, 7b is inserted into the tubular profile 30 and fixed by means of a terminal screw 31 of the screw-terminal-type connecting element 28. By virtue of the fixing by means of the terminal screw 31, the shielding-conductor section 7a, 7b is electrically connected to the terminal block 29 and hence to the shielding element 14.

The upper housing part 18 can, as shown in FIG. 3, be non-destructively detached from the lower housing part 19. For this purpose, the housing 16 exhibits, for instance, a snap-action connection 32. The snap-action connection 32 is formed here by elastic snap-action hooks 33 on the upper housing part 18 and by projections 34 on the lower housing part 19. In order to be able to exchange the defective cut-out 11, the snap-action connection 32 is released, by the snap-action hooks 33 being detached from the projections 34. After the snap-action connection 32 has been released, the upper housing part 18 can be removed from the lower housing part 19, and the cut-out 11 can be removed by the plug connection 25 being released, for instance by the cut-out 11 simply being pulled out. Then a functional cut-out 11 can be connected to the conductor sections 5a, 5b, for instance by being plugged in, and the upper housing part 18 can be placed back onto the lower housing part 19 for the purpose of sealing the housing 16. For this purpose, the upper housing part 18 and the lower housing part 19 exhibit guide elements 35, 36 corresponding to one another. The guide elements 35 on the upper-housing-part side may be, for instance, pins or bolts which can be inserted into the guide elements 36 on the lower-housing-part side in the form of blind holes. As soon as the snap-action hooks 33 have been snapped onto the projections 34, the upper housing part 18 and the lower housing part 19 have been mechanically connected again.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A protective device to be integrated into a high-voltage cable of a high-voltage on-board power supply, comprising:
   a cut-out for interrupting at least one electrical conductor of the high-voltage cable in a fault scenario;
   a shielding element for forming a cable shield with a shielding conductor of the high-voltage cable; and
   a housing to be arranged between two high-voltage-cable sections of the high-voltage cable, in which housing the cut-out and the shielding element are arranged and which has contacts for connecting the cut-out to conductor sections of the at least one conductor and for connecting the shielding element to shielding-conductor sections of the shielding conductor, wherein at least a part of the housing is capable of being non-destructively detached from the high-voltage-cable sections in order to enable an exchange of at least the cut-out in the case of a defect of the cut-out.

2. The protective device as claimed in claim 1, wherein the cut-out takes the form of at least one fusible cut-out and/or at least one temperature-controlled bimetallic switch.

3. The protective device as claimed in claim 1, wherein the housing comprises a lower housing part and an upper housing part, the lower housing part, in which the cut-out and the shielding element are arranged, is fastened to the high-voltage-cable sections, and the upper housing part is fastened to the lower housing part in a non-destructively detachable manner in order to open the housing for an exchange of the cut-out.

4. The protective device as claimed in claim 3, wherein the upper housing part is fastened to the lower housing part via a snap-action connection.

5. The protective device as claimed in claim 3, wherein the upper housing part and the lower housing part have guide elements corresponding to one another for joining the upper housing part and the lower housing part together.

6. The protective device as claimed in claim 1, wherein the contacts are grommet conduits in a housing wall of the housing, and the shielding-conductor sections and the conductor sections are capable of being routed through the conduits and capable of being electrically connected to the shielding element and to the cut-out.

7. The protective device as claimed in claim 1, wherein the protective device has plug-connection elements which are electrically connected to the cut-out and are capable of being electrically connected to corresponding plug-connection elements of the conductor sections.

8. The protective device as claimed in claim 1, wherein the protective device has screw-terminal-type connecting elements which each have a terminal block, which is electrically connected to the shielding element, and a terminal screw for connecting the shielding-conductor sections of the high-voltage cable to the terminal block.

9. A high-voltage cable for a high-voltage on-board power supply, comprising:

at least one electrical conductor;

a shielding conductor; and at least one protective device, the protective device being arranged between two high-voltage-cable sections which each have a conductor section and a shielding-conductor section, wherein the protective device comprises:

a cut-out for interrupting the at least one electrical conductor of the high-voltage cable in a fault scenario;

a shielding element for forming a cable shield with the shielding conductor of the high-voltage cable; and a housing to be arranged between the two high-voltage-cable sections of the high-voltage cable, in which housing the cut-out and the shielding element are arranged and which has contacts for connecting the cut-out to conductor sections of the at least one conductor and for connecting the shielding element to shielding-conductor sections of the shielding conductor, wherein at least a part of the housing is capable of being non-destructively detached from the high-voltage-cable sections in order to enable an exchange of at least the cut-out in the case of a defect of the cut-out.

10. The high-voltage cable as claimed in claim 9, wherein the high-voltage cable is configured to be ready to connect and has at least one plug connector for electrically connecting the high-voltage cable to at least one high-voltage component of the high-voltage on-board power supply.

11. A high-voltage on-board power supply for a motor vehicle, comprising:

at least two high-voltage components; and at least one high-voltage cable as claimed in claim 9, which electrically connects the at least two high-voltage components.

12. A motor vehicle comprising a high-voltage on-board power supply as claimed in claim 11.

* * * * *